United States Patent
Mass et al.

(10) Patent No.: US 9,763,317 B2
(45) Date of Patent: Sep. 12, 2017

(54) METHOD AND APPARATUS FOR PROVIDING A GROUND AND A HEAT TRANSFER INTERFACE ON A PRINTED CIRCUIT BOARD

(71) Applicant: Cisco Technology, Inc., San Jose, CA (US)

(72) Inventors: James A. Mass, North Royalton, OH (US); David Lynn Artman, Bruswick, OH (US); Timothy A. Frank, Parma, OH (US)

(73) Assignee: Cisco Technology, Inc., San Jose, CA (US)

( * ) Notice: Subject to any disclaimer, the term of this patent is extended or adjusted under 35 U.S.C. 154(b) by 777 days.

(21) Appl. No.: 13/803,828

(22) Filed: Mar. 14, 2013

(65) Prior Publication Data
US 2014/0268580 A1    Sep. 18, 2014

(51) Int. Cl.
*B23K 31/02* (2006.01)
*H05K 1/02* (2006.01)
(Continued)

(52) U.S. Cl.
CPC ......... *H05K 1/0204* (2013.01); *B23K 1/0016* (2013.01); *B23K 2201/36* (2013.01);
(Continued)

(58) Field of Classification Search
None
See application file for complete search history.

(56) References Cited

U.S. PATENT DOCUMENTS 4,737,395 A * 4/1988 Mabuchi ............... H01L 23/13
174/255
5,542,175 A * 8/1996 Bhatt ............... H01L 21/4807
156/247
(Continued)

FOREIGN PATENT DOCUMENTS

CN   WO 2012013546 A1 *  2/2012   .......... H05K 1/0204
DE       20 2006 013863 U1   11/2006
(Continued)

OTHER PUBLICATIONS

Robert Tarzwell; The Bleeding Edg: Printed Electronics Meets LED; Aug. 27, 2009; www.pcbdesign007.com/pages/columns.cgi?clmid=9&artid=52723&_pf_=1.
(Continued)

*Primary Examiner* — Kiley Stoner
(74) *Attorney, Agent, or Firm* — P. Su (57) ABSTRACT

In one embodiment, a printed circuit board (PCB) assembly includes a PCB, the PCB being arranged to define a through-hole therein, the through-hole having a surface, wherein the PCB includes a top surface and a bottom surface. The PCB assembly also includes a slug arrangement and a surface mount component. The slug arrangement is formed from an electrically and thermally conductive material and includes at least a first portion and a second portion. At least a part of the first portion is positioned in the through-hole, and the second portion is coupled to the bottom surface. The surface mount component is positioned over the through-hole and the top surface, and has a first surface configured to contact the first portion.

14 Claims, 7 Drawing Sheets

(51) Int. Cl.
*B23K 1/00* (2006.01)
*B23K 101/36* (2006.01)
*H05K 3/00* (2006.01)

(52) U.S. Cl.
CPC ......... *H05K 1/0243* (2013.01); *H05K 3/0061* (2013.01); *H05K 2201/0959* (2013.01); *H05K 2201/10416* (2013.01); *Y10T 29/49128* (2015.01); *Y10T 29/49165* (2015.01)

(56) References Cited

U.S. PATENT DOCUMENTS

| | | | | |
|---|---|---|---|---|
| 5,617,294 | A | * | 4/1997 | Watson ............... H01L 21/4882 174/16.3 |
| 5,699,613 | A | * | 12/1997 | Chong ................. H01L 21/486 174/264 |
| 6,268,239 | B1 | | 7/2001 | Ikeda |
| 6,411,516 | B1 | * | 6/2002 | Palumbo ............. H01L 23/3677 174/252 |
| 6,821,821 | B2 | | 11/2004 | Fjelstad |
| 7,327,028 | B2 | | 2/2008 | Chiu |
| 7,537,668 | B2 | | 5/2009 | Watanabe |
| 7,560,309 | B1 | | 7/2009 | Kao et al. |
| 7,585,419 | B2 | | 9/2009 | Cheng |
| 8,405,203 | B2 | | 3/2013 | Kearney et al. |
| 8,623,707 | B2 | | 1/2014 | Kearney et al. |
| 8,921,707 | B2 | * | 12/2014 | Ohnuki ................... H05K 1/05 174/257 |
| 2003/0100197 | A1 | | 5/2003 | Veitschegger |
| 2007/0023868 | A1 | * | 2/2007 | Ho ................... H01L 21/76808 257/621 |
| 2007/0086695 | A1 | * | 4/2007 | Hsu ........................ H01L 23/48 385/14 |
| 2007/0095471 | A1 | * | 5/2007 | Ito ....................... H01L 23/5385 156/293 |
| 2010/0187003 | A1 | * | 7/2010 | Tsai ....................... H05K 3/205 174/263 |
| 2012/0092834 | A1 | * | 4/2012 | Tain .................... H01L 23/3735 361/717 |
| 2013/0127567 | A1 | * | 5/2013 | Iyer ..................... H03H 7/0138 333/182 |
| 2013/0210196 | A1 | | 8/2013 | Kearney et al. |
| 2013/0320561 | A1 | * | 12/2013 | Park .................. H01L 23/49827 257/774 |
| 2014/0332067 | A1 | * | 11/2014 | Graddy, Jr. .............. H01B 1/22 136/256 |
| 2016/0021730 | A1 | * | 1/2016 | Decker ..................... H05K 1/18 361/720 |

FOREIGN PATENT DOCUMENTS

| | | |
|---|---|---|
| EP | 1 445 799 A2 | 8/2004 |
| EP | 1 503 615 A2 | 2/2005 |
| EP | 2 180 595 A1 | 4/2010 |
| KR | WO 2011013966 A2 * | 2/2011 |
| WO | WO 2004/103038 A1 | 11/2004 |
| WO | WO 2010/094154 A1 | 8/2010 |

OTHER PUBLICATIONS

Lee et al.; Coin Insertion Technology for PCB Therman Solution; IMPACT, 2010 5th International; Oct. 20-22, 2010;http://ieeexplore.ieee.org/stamp/stamp.jsp?arnumber=05699524.

* cited by examiner

METHOD AND APPARATUS FOR PROVIDING A GROUND AND A HEAT TRANSFER INTERFACE ON A PRINTED CIRCUIT BOARD

TECHNICAL FIELD

The disclosure relates generally to the fabrication of printed circuit boards. More particularly, the disclosure relates to providing an interface which allows a surface mounted component of a printed circuit board to be electrically grounded and to efficiently engage in heat transfer.

BACKGROUND

In order for a printed circuit board (PCB) assembly to perform as desired, some components mounted on the PCB are electrically grounded, and heat is transferred away from electrical components. When components mounted on a PCB are not properly grounded, and/or thermal relief is not effectively provided, the performance of the PCB may be compromised.

Some surface mount components, e.g., surface mount radio frequency (RF) power amplifiers, include ground paddles that are configured to facilitate grounding of the components. A surface mount power amplifier generally includes a built-in ground paddle that is configured to be positioned such that the built-in ground paddle directly contacts a surface of the PCB with which the built-in ground paddle is to mate. Thermal relief is generally provided to the surface mount power amplifier by way of a matrix of plated through-holes, or vias, in the PCB over which the surface mount power amplifier is positioned. While the use of a matrix of plated through-holes may improve the transfer of heat away from a surface mount power amplifier, the PCB often significantly inhibits heat transfer away from the surface mount power amplifier.

BRIEF DESCRIPTION OF THE DRAWINGS

The disclosure will be readily understood by the following detailed description in conjunction with the accompanying drawings in which.

DESCRIPTION OF EXAMPLE EMBODIMENTS

General Overview

According to one aspect, a printed circuit board (PCB) assembly includes a PCB, the PCB being arranged to define a through-hole therein, the through-hole having a surface, wherein the PCB includes a top surface and a bottom surface. The PCB assembly also includes a slug arrangement and a surface mount component. The slug arrangement is formed from an electrically and thermally conductive material and includes at least a first portion and a second portion. At least a part of the first portion is positioned in the through-hole, and the second portion is coupled to the bottom surface. The surface mount component is positioned over the through-hole and the top surface, and has a first surface configured to contact the first portion.

Description

Heat generated by a printed circuit board (PCB) often has an adverse effect on the performance of the PCB. In addition, when components on a PCB are not properly grounded, the performance of the PCB may be compromised. Thus, providing a proper ground as well as effective thermal relief allows the performance of a PCB to be enhanced.

By providing a relatively large conductive surface area on a PCB, heat may be efficiently conducted away from components of the PCB and, therefore, heat flux away from the components of the PCB may be increased. An arrangement or an assembly, e.g., a slug arrangement or slug assembly, which is highly conductive and has a relatively large surface area may be mounted on a PCB to efficiently conduct heat away from a surface mount component such as a power amplifier. An increased conductive area enables an improved ground to be provided, and may provide improved interface to an additional heat transfer component such as a heat sink. Therefore, an increased conductive area improves the performance of a PCB.

A slug arrangement may be positioned at least partially in a through-hole of a PCB such that the slug arrangement may be substantially directly coupled to a surface mount component positioned over the through-hole. In one embodiment, a slug arrangement is a high-thermal and electrical conductivity interface that may be configured to interface with a ground paddle of a surface mount radio frequency (RF) power amplifier to provide an efficient ground and to conduct heat away from the power amplifier. A slug arrangement may be arranged to effectively mate with a through-hole on a PCB such that when a surface mount component is mounted substantially over the through-hole, the slug arrangement may conduct heat away from the surface mount component.

Figure 1A:
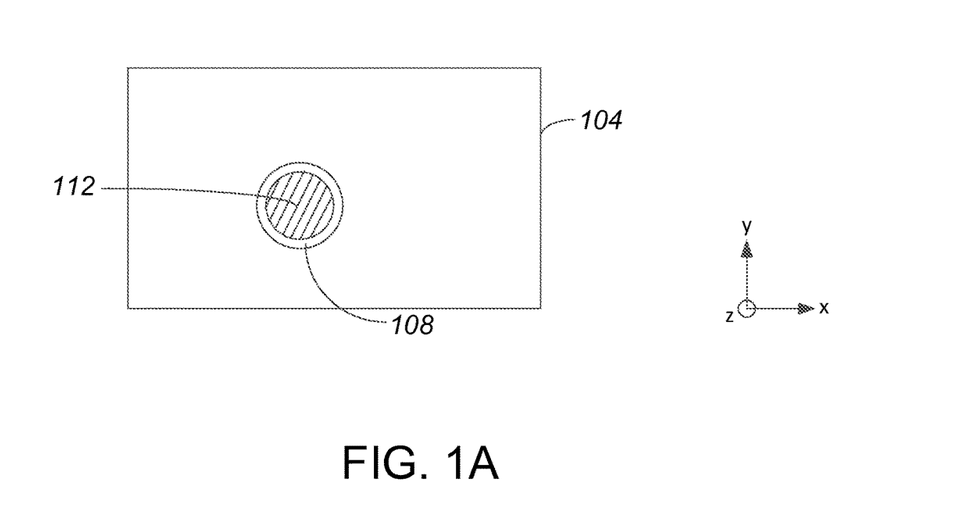
FIG. 1A is a diagrammatic top-view representation of a printed circuit board (PCB) that includes a plated through-hole in which a portion of a slug arrangement has been inserted in accordance with an embodiment.
Figure 1B:
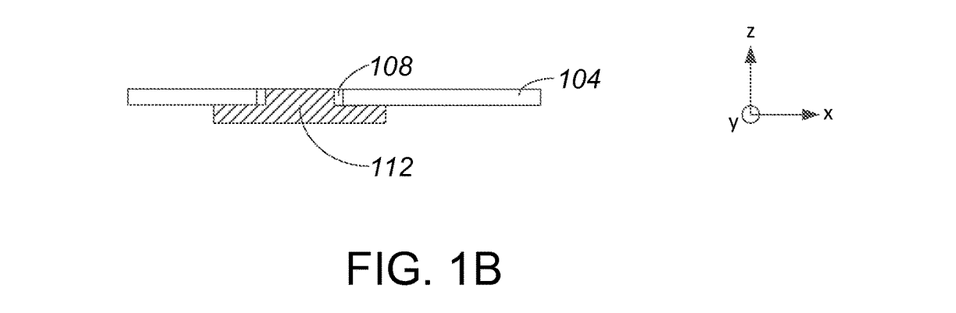
FIG. 1B is a diagrammatic cross-sectional side-view representation of a PCB, e.g., PCB 104 of FIG. 1A, in which a portion of a slug arrangement is inserted through a plated through-hole in accordance with an embodiment.
Figure 1C:
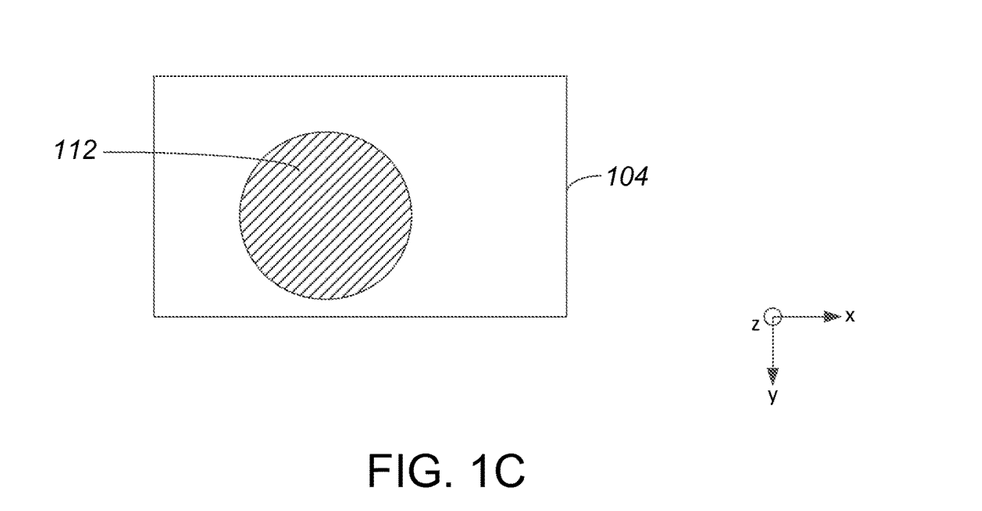
FIG. 1C is a diagrammatic bottom-view representation of a PCB, e.g., PCB 104 of FIG. 1A, in which a portion of a slug arrangement is inserted through a plated through-hole in accordance with an embodiment.

Referring initially to FIGS. 1A-C, a PCB assembly that includes a PCB with a plated through-hole in which a portion of a slug arrangement or a conducting component is inserted will be described in accordance with an embodiment. A PCB assembly generally includes a PCB 104, a plated through-hole or via 108, and a slug arrangement 112. It should be appreciated that while PCB 104 typically includes a plurality of traces and components, such traces and components have not been shown on PCB 104 for ease of illustration.

A slug arrangement 112 is configured to be at least partially inserted within plated through-hole 108. As shown, a portion of slug arrangement 112 is configured to contact a bottom surface of PCB 104. The amount of surface area associated with slug arrangement 112 may vary widely. In general, increasing the surface area associated with slug arrangement 112 may improve the performance of a component (not shown) mounted over plated through-hole 108 and slug arrangement 112. However, it should be appreciated that the amount of surface area associated with slug arrangement 112 may be constrained by factors such as the placement of components (not shown) on PCB 104. Further, the shape of slug arrangement 112 may be selected based upon the amount of space available on a surface, as for example a bottom surface, of PCB 104.

Figure 2:
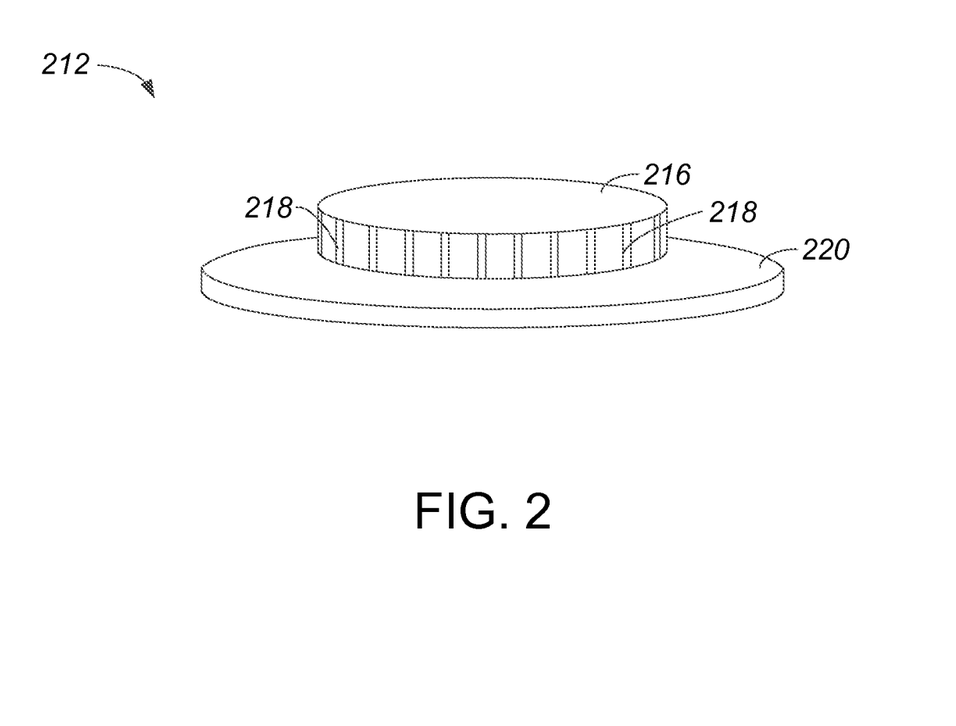
FIG. 2 is a diagrammatic representation of a first slug arrangement in accordance with an embodiment of the present invention.

In one embodiment, a slug arrangement or assembly may include a cap portion and a plate portion. FIG. 2 is a diagrammatic representation of a slug arrangement that includes a cap portion and a plate portion in accordance with an embodiment of the present invention. A slug arrangement 212 includes a cap portion 216, e.g., a plug section configured to be at least partially inserted within a through-hole of a PCB, and a plate portion 220, e.g., a base section configured to effectively contact a surface of a PCB while cap portion 216 is at least partially inserted within a through-hole of the PCB. Cap portion 216 may include features 218 that facilitate a process of assembling slug arrangement 212 to a PCB. Features 218 may be protrusions located around the edges of cap portion 216 which facilitate the attachment of cap portion 216 to walls of a through-hole (not shown) of a PCB using solder. Features 218 may be configured, for example, to provide intermittent force fit features and/or staking features that allow cap portion 216 to fit against walls of a through-hole (not shown).

Slug arrangement 212 is generally formed from a conductive material such as aluminum or copper. In one embodiment, the conductive material may be a highly conductive material. Slug arrangement 212 may effectively be formed as a single piece, i.e., such that cap portion 216 and plate portion 220 are integrally formed. Alternatively, slug arrangement 212 may be formed as separate pieces which are coupled together by adhesives, solder, and/or mechanical fasteners. That is, cap portion 218 and plate portion 220 may be separate pieces which are coupled together to form slug arrangement 212.

In general, the dimensions of slug arrangement 212 may vary widely depending upon the requirements of an overall PCB assembly of which slug arrangement 212 is a part. For example, a diameter of cap portion 216 may be approximately the same as a diameter of a through-hole (not shown) of a PCB into which cap portion 216 is to be inserted, and a height of cap portion 216 may be approximately the same as a thickness of the PCB.

Figure 3:
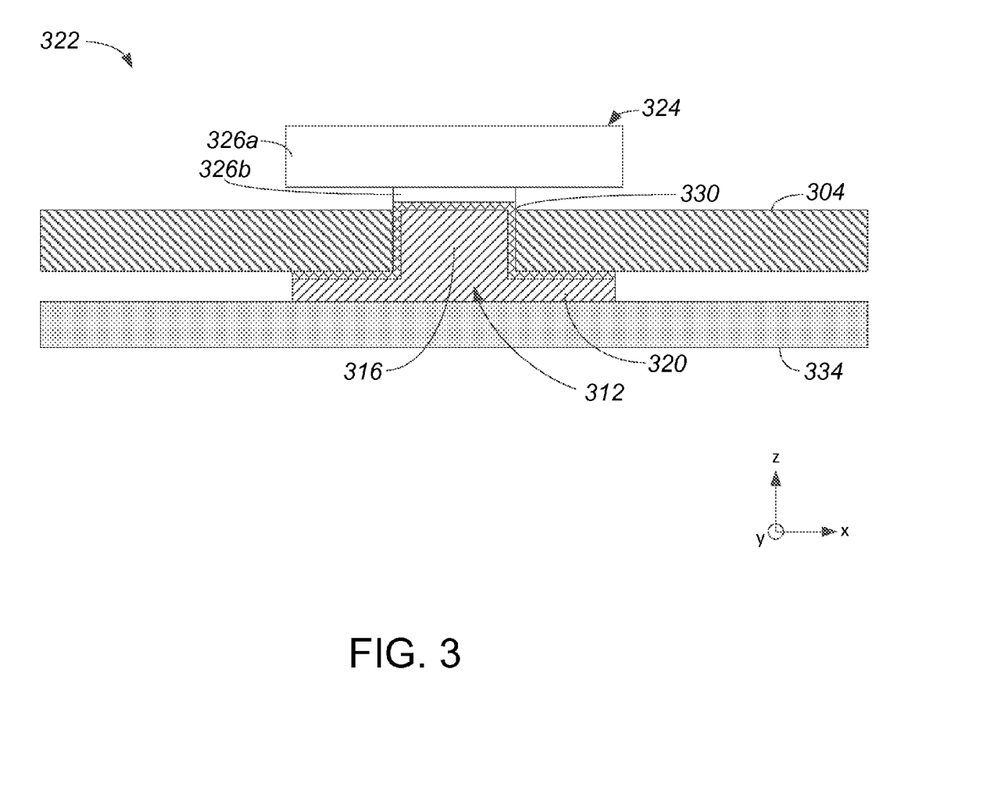
FIG. 3 is a diagrammatic cross-sectional side-view representation of a PCB assembly that includes a slug arrangement which has two sections in accordance with an embodiment.

A slug arrangement such as slug arrangement 212 may be assembled to a PCB using solder. In other words, a slug attachment may be coupled to or otherwise attached to a PCB using solder. With reference to FIG. 3, a PCB assembly which includes a slug arrangement that has a cap portion and a plate portion will be described in accordance with an embodiment. A PCB assembly 322 includes a PCB 304, a slug arrangement 312, a surface mount component 324, and a thermally conductive material 334 which functions as a heat transfer component. It should be appreciated that PCB assembly 322 is not drawn to scale, and the sizes of various parts of PCB assembly 322 have been exaggerated for purposes of illustration. Further, it should also be appreciated that the configuration of components shown as a part of PCB assembly 322 may vary. For example, components included in PCB assembly 322 may generally be configured such that surface mount component 324 may rest on PCB 304 in some embodiments.

A cap portion 316 of slug arrangement 320 is positioned within an opening, e.g., a through-hole which may be a plated through-hole, defined in PCB 304. A plate portion 320 of slug arrangement 312 is positioned on one side, as for example beneath a bottom surface, of PCB 304. Plate portion 320 may be configured to contact thermally conductive material 334, e.g., a heat sink. In one embodiment, thermally conductive material 334 may be a plastic substrate or a piece of sheet metal that may effectively absorb heat transferred through slug arrangement 320. It should be appreciated that plate portion 320 may instead come into contact with a thermal interface such as a gap sealing material (not shown) to transfer heat to thermally conductive material 334.

A top surface of cap portion 316 is arranged to substantially interface with a surface of component 324. In the described embodiment, component 324 is a surface mount RF power amplifier 326a with a built-in ground paddle 326b. An overall solder interface 330 effectively couples the top surface of cap portion 316 to ground paddle 326b, and also generally couples slug arrangement 312 to PCB 304. As shown, solder interface 330 includes a section arranged between ground paddle 326b and the top surface of cap portion 316, a section arranged between a surface of the through-hole defined in PCB 304 and the a surface of cap portion 316, and a section arranged between a bottom surface of PCB 304 and a top surface of plate portion 320.

It should be appreciated that the top surface of cap portion 316 may be substantially even with a top surface of PCB 304. However, the top surface of cap portion 316 may instead be recessed with respect to the top surface of PCB 304. When the top surface of cap portion 316 is not substantially even with the top surface of PCB 304, solder interface 330 may effectively fill in any gap between the top surface of cap portion 316 and ground paddle 326b.

Figure 4:
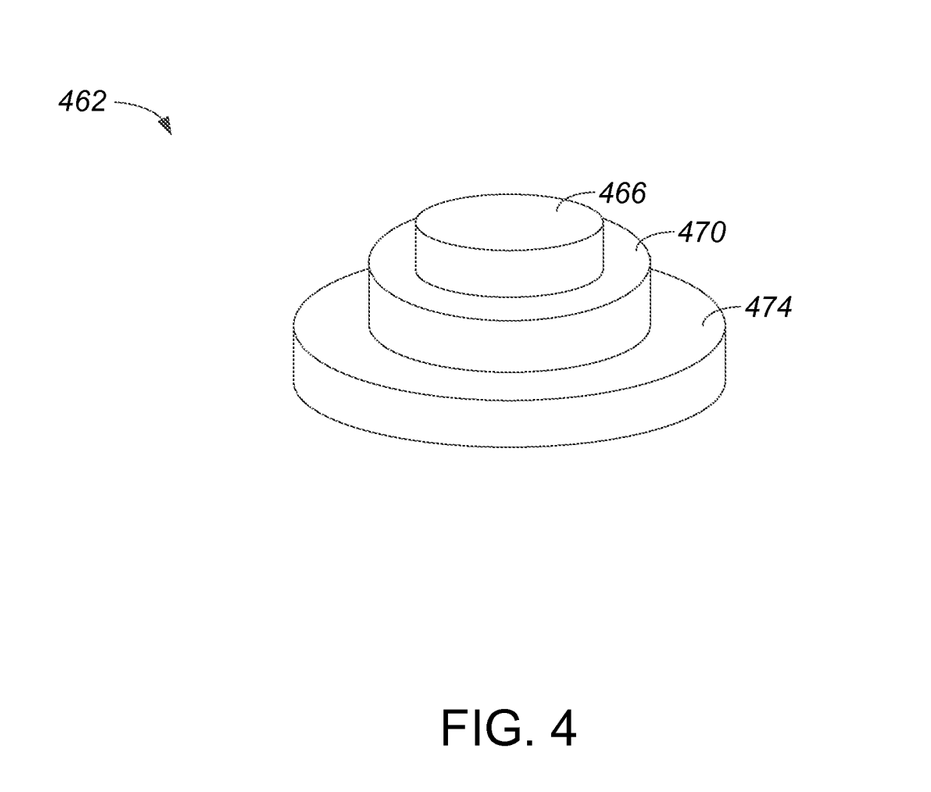
FIG. 4 is a diagrammatic representation of a second slug arrangement in accordance with an embodiment.

In some embodiments, an adhesive may be used to effectively hold a slug arrangement in place during a PCB assembly process. FIG. 4 is a diagrammatic representation of a slug arrangement that is suitable for supporting the application of an adhesive during a PCB assembly process in accordance with an embodiment. A slug arrangement 462, which is generally formed from a conductive material, includes a cap portion 466, e.g., a section configured to be at least partially inserted within a through-hole of a PCB, a first plate portion 470, and a second plate portion 474. Cap portion 466 may include features (not shown) such as protrusions that facilitate a process of assembling slug arrangement 462 to a PCB.

First plate portion 470 is configured such that a top surface of first plate portion 470 may be coupled to a surface of a PCB using solder. That is, the top surface of first plate portion 470 may be soldered to a surface of a PCB. Second plate portion 474 is configured such that a top surface of second plate portion 474 may be coupled to a surface of a PCB using an adhesive, e.g., a relatively high temperature adhesive such as an epoxy or a ceramic adhesive.

Cap portion 466, first plate portion 470, and second plate portion 474 may be formed from a single piece of conductive material. Alternatively, cap portion 466, first plate portion 470, and second plate portion 474 may be formed from separate pieces of conductive material which are joined together to form slug arrangement 462.

Figure 5:
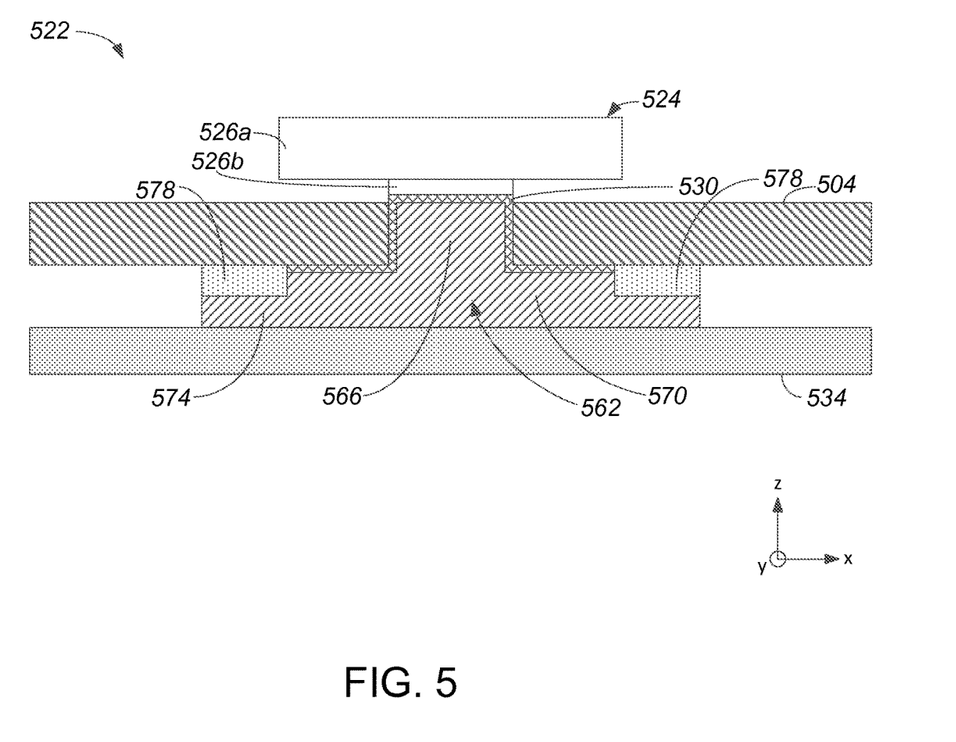
FIG. 5 is a diagrammatic cross-sectional side-view representation of a PCB assembly that includes a slug arrangement which is arranged to be at least partially attached to a PCB using an adhesive material in accordance with an embodiment.

Referring next to FIG. 5, a PCB assembly that includes a slug arrangement which is arranged to be at least partially attached to a PCB using an adhesive will be described in accordance with an embodiment. A PCB assembly 522 includes a PCB 504, a slug arrangement 562, a surface mount component 524, and a thermally conductive material 534, e.g., a heat sink. It should be appreciated that PCB assembly 522 is not drawn to scale, and the sizes of various parts of PCB assembly 522 have been exaggerated for purposes of illustration.

In one embodiment, surface mount component 524 includes a power amplifier portion 526a and a ground paddle 526b. Ground paddle 526b may effectively be built into power amplifier portion 526a.

A cap portion 566 of slug arrangement 562 is positioned within an opening, e.g., a through-hole which may be a plated through-hole, defined in PCB 504. A solder interface 530 is arranged to effectively couple cap portion 566 to ground paddle 526b and to the edges of the opening defined within PCB 504.

A first plate portion 570 of slug arrangement 562 is positioned on one side of PCB 504, e.g., beneath a bottom surface of PCB 504. First plate portion 570 is configured to be coupled to PCB 504 through solder interface 530. A second plate portion 574 of slug arrangement 562 is arranged to be in contact with thermally conductive material 534. A top surface of second plate portion 574 may be substantially attached to a bottom surface of PCB 504 using an adhesive 578.

Figure 6A:
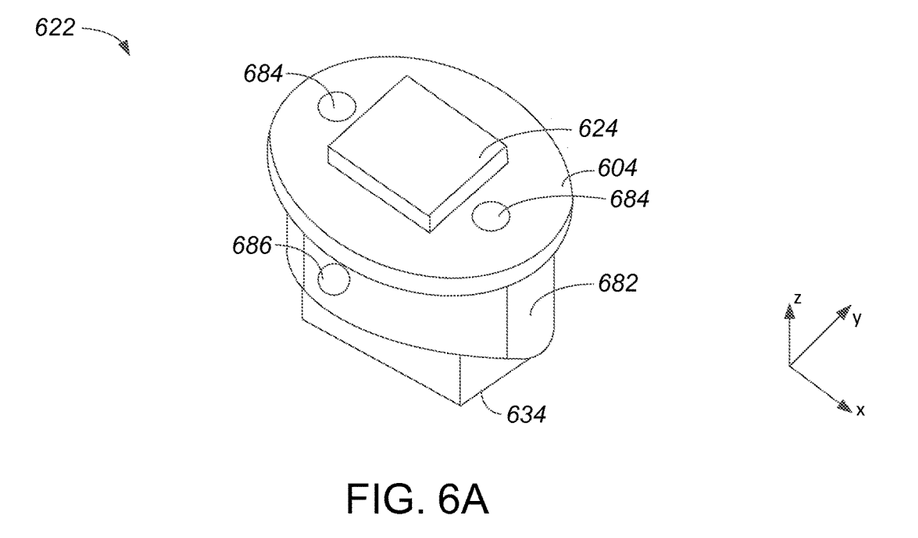
FIG. 6A is a diagrammatic representation of a portion of a PCB assembly that includes a slug assembly which is configured to enable compensation in a variation in the thickness of a PCB in accordance with an embodiment.
Figure 6B:
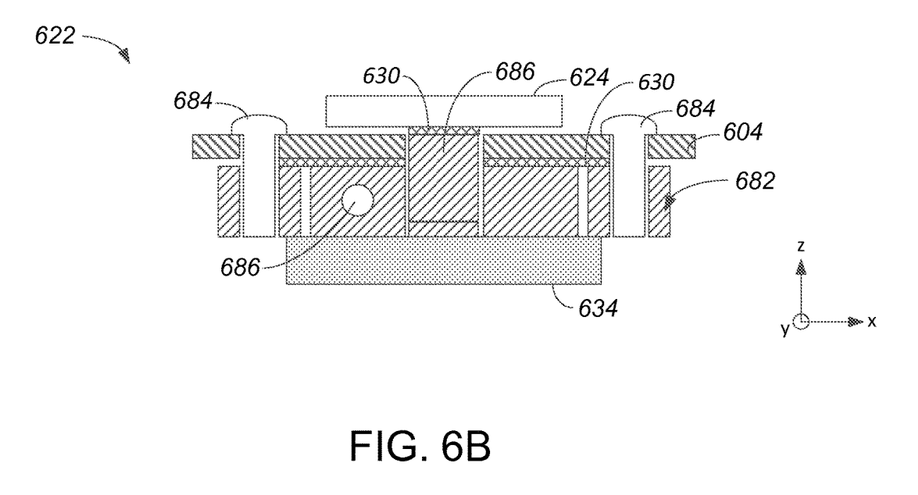
FIG. 6B is a diagrammatic cross-sectional side-view representation of a PCB assembly that includes a slug assembly, e.g., slug assembly 682 of FIG. 6A, which is configured to enable compensation of a variation in the thickness of a PCB in accordance with an embodiment.

In general, a solder interface such as solder interface 320 of FIG. 3 or solder interface 530 of FIG. 5 may be effective in compensating for variations in the thickness of a PCB. For example, a solder interface may provide capillary action and/or solder wicking that effectively compensates for tolerance stack-ups associated with a PCB assembly. However, some slug arrangements may be configured to compensate for variations in PCB thicknesses. FIGS. 6A and 6B are diagrammatic representations of a portion of a PCB assembly that includes a slug arrangement configured to enable compensation in a variation in the thickness of a PCB in accordance with an embodiment. A PCB assembly 622 includes a PCB 604, a surface mount component 624, a slug arrangement 682, and a thermally conductive material 634. Surface mount component 624 may be a power amplifier that has a built-in ground paddle. Thermally conductive material 634 may be a heat sink, and is arranged to substantially conduct heat away from surface mount component 624 and slug arrangement 682.

Slug arrangement 682 includes a vertical compensation element 686 that is configured to adjust vertically to compensate for a variation in the thickness of PCB 604. A clamp screw 686 is arranged to secure vertical compensation element 686 in place relative to the rest of slug arrangement 682 once vertical compensation element 686 is positioned in a desired position. Screws 684 are arranged to secure, or to mechanically couple, slug arrangement 682 to PCB 604. It should be appreciated that in lieu of screws 684, any suitable fastener may be used to hold slug arrangement 682 to PCB 604.

A solder interface 630 is arranged at least between a top surface of vertical compensation element 686 and surface mount component 624, and between a top surface of the body of slug arrangement 682 and PCB 604.

Figure 7:
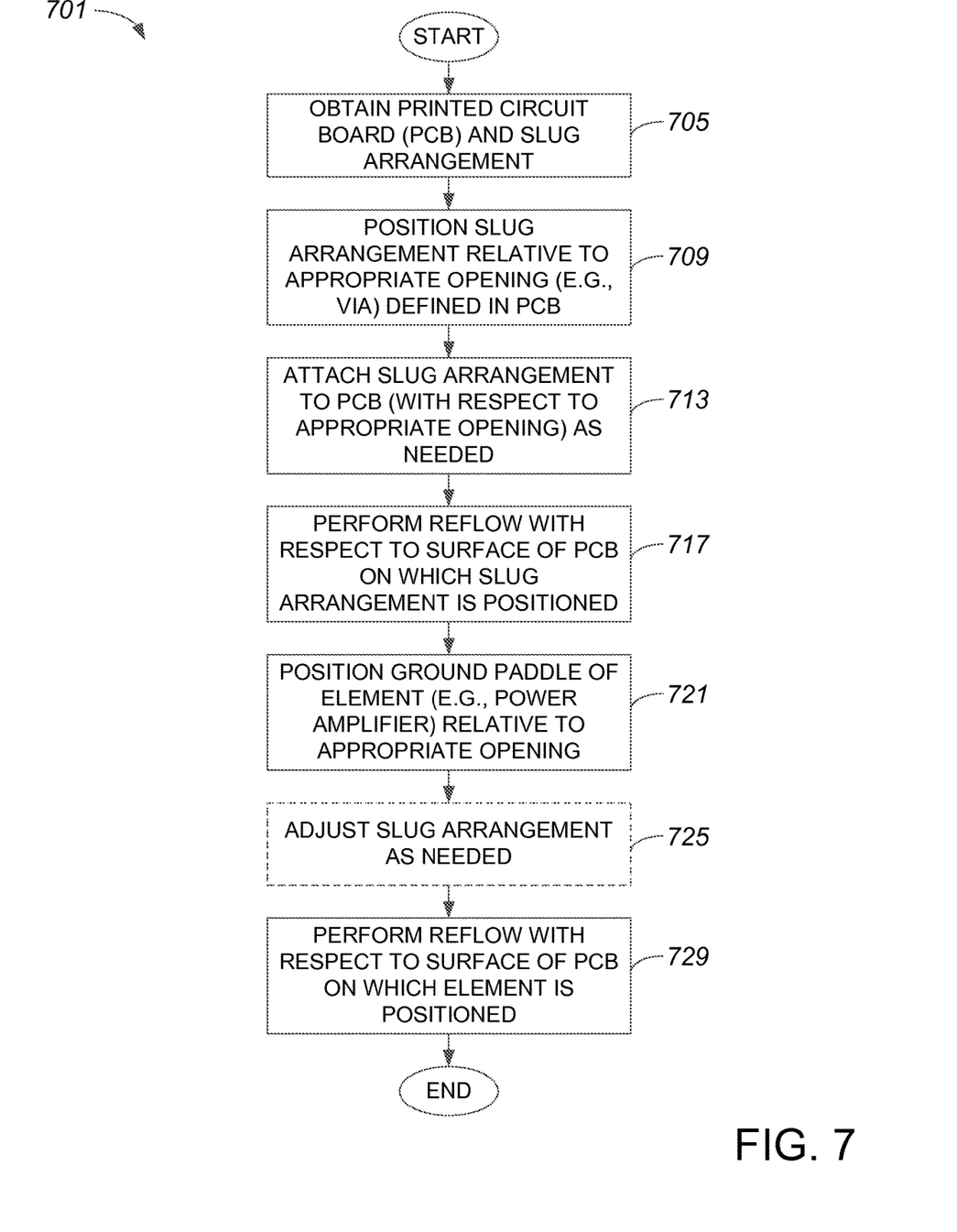
FIG. 7 is a process flow diagram which illustrates one method of creating a PCB assembly that includes a slug assembly in accordance with an embodiment.

FIG. 7 is a process flow diagram which illustrates one method of creating a PCB assembly that includes a slug arrangement in accordance with an embodiment. A method 701 of creating a PCB assembly begins at step 705 in which a PCB and a slug arrangement are obtained. Once a PCB and a slug arrangement are obtained, the slug assembly is positioned relative to an appropriate opening in the PCB in step 709. By way of example, a slug arrangement may be positioned such that a cap portion of the slug arrangement is positioned within a through-hole or within a via.

After the slug arrangement is positioned relative to an appropriate opening in the PCB, the slug arrangement may be attached to the PCB with respect to the appropriate opening as needed in step 713. For example, at least one mechanical fastener may be used to fasten the slug arrangement to the PCB, or an adhesive may be used to couple the slug arrangement to the PCB.

From step 713, process flow proceeds to step 717 in which reflow is performed with respect to the surface of the PCB on which the slug arrangement is positioned. As will be appreciated by those skilled in the art, reflow is one method of attaching components to a PCB, and causes solder to effectively connect the components to the PCB. It should also be appreciated that prior to reflow, solder paste may be screened onto the PCB.

In step 721, a surface mount element that is to be coupled to the slug arrangement is positioned on a surface of the PCB relative to the appropriate opening, i.e., the opening within which a cap portion of the slug arrangement is positioned. The surface mount element may be a power amplifier with a built-in ground paddle. As such, the ground paddle may be positioned relative to the appropriate opening, e.g., substantially over the appropriate opening.

The slug arrangement is adjusted as needed in an optional step 725. For example, in an embodiment in which a slug arrangement includes a vertical compensation element, the vertical compensation element may be adjusted. Reflow is performed in step 729 with respect to the surface of the PCB on which the surface mount element is positioned. Once reflow is performed and the surface mount element is attached to the PCB, the method of creating a PCB assembly is completed.

Although only a few embodiments have been described in this disclosure, it should be understood that the disclosure may be embodied in many other specific forms without departing from the spirit or the scope of the present disclosure. By way of example, a slug arrangement or assembly that provides increased heat transfer capabilities and an efficient electrical ground is not limited to being used with respect to a power amplifier. For instance, a slug assembly may be used with any suitable component which includes a built-in ground paddle. In addition, a slug assembly may generally be used with respect to any element or component of a PCB which may benefit from increased heat transfer capabilities and an efficient electrical ground.

While a slug assembly has been described as being formed from copper, or from aluminum plated with copper, a slug assembly may generally be formed from any suitable material. In addition, any suitable process may generally be used to manufacture a slug assembly. By way of example, a slug assembly may be machined from a piece of metal, e.g., aluminum, and then plated with copper. Alternatively, a slug assembly may be machined from copper. In lieu of machining a slug assembly, other fabrication process such as cold forming may be used to form a slug assembly. In some instances, a slug assembly may be formed from separate pieces of metal and then attached, e.g., using adhesives and/or mechanical fasteners such as screws.

The size and the shape of a slug arrangement may generally vary widely. The size and the shape of a slug arrangement may vary based upon the requirements associated with a PCB assembly of which the slug arrangement is a part. While a diameter of a cap portion of a slug arrangement is generally larger than a diameter of a plate portion of a slug arrangement, the actual diameters of the cap portion and the plate portion may vary.

In one embodiment, a slug arrangement may be configured to pass from one side of a PCB to an opposite side of the PCB in more than one location. That is, a slug arrangement may include features which are arranged to protrude through a PCB. For example, in addition to having a cap portion that is effectively positioned within a through-hole or a via or a PCB, a slug assembly may include at least one protrusion that is arranged to pass through another opening in the PCB and may support a heat sink substantially over a power amplifier that is conductively coupled to the cap portion of the slug assembly.

The steps associated with the methods of the present disclosure may vary widely. Steps may be added, removed, altered, combined, and reordered without departing from the spirit of the scope of the present disclosure. By way of example, a method of creating a PCB assembly that includes a slug arrangement may generally include standard PCB assembly and/or fabrication steps which have not been shown for ease of discussion. For instance, solder paste may be screened onto a PCB prior to a reflow process performed with respect to a surface of the PCB on which a slug arrangement is positioned. Therefore, the present examples are to be considered as illustrative and not restrictive, and the examples is not to be limited to the details given herein, but may be modified within the scope of the appended claims.

What is claimed is:

1. A method comprising:
   obtaining a printed circuit board (PCB), the PCB including a top surface and a bottom surface, wherein the PCB has an opening defined therein;
   obtaining a slug arrangement, the slug arrangement being formed from an electrically and thermally conductive material, the slug arrangement including at least a first portion and a second portion,
   coupling the slug arrangement to the PCB, wherein coupling the slug arrangement to the PCB includes positioning at least a section of the first portion within the opening, adjusting the slug arrangement to compensate for a variation in the thickness of the PCB, and creating a first solder interface between the first portion and the PCB; and
   coupling a surface mount element to the slug arrangement, the surface mount element having a first surface, wherein coupling the surface mount element to the slug arrangement includes creating a second solder interface between the first surface and the first portion.

2. The method of claim 1 wherein coupling the slug arrangement to the PCB further includes creating a third solder interface between the second portion and the bottom surface.

3. The method of claim 1 wherein coupling the slug arrangement to the PCB further includes creating a third solder interface between the second portion and the PCB.

4. The method of claim 1 further including:
   mechanically coupling the PCB to the slug arrangement.

5. The method of claim 1 wherein the surface mount element is a radio frequency (RF) power amplifier, the first surface being a ground paddle of the RF amplifier, the method further including positioning the ground paddle over the opening, and wherein creating the second solder interface between the first surface and the first portion includes creating the second solder interface between the ground paddle and an upper surface of the first portion.

6. The method of claim 1 wherein the electrically and thermally conductive material is one selected from a group including copper, aluminum, and copper-plated aluminum.

7. The method of claim 1 wherein the slug arrangement further includes a third portion, the third portion being coupled to the bottom surface with an adhesive material.

8. The method of claim 1 wherein the opening is a plated through-hole.

9. The method of claim 1 wherein the thermally conductive material is a plastic substrate.

10. The method of claim 1 wherein the thermally conductive material is a metal substrate.

11. A method comprising:
    obtaining a printed circuit board (PCB), the PCB including a top surface and a bottom surface, wherein the PCB has a through-hole defined therein;
    obtaining a slug arrangement, the slug arrangement being formed from an electrically and thermally conductive material, the slug arrangement including at least a first portion and a second portion, the first portion being a cap portion and the second portion being a plate portion;
    coupling the slug arrangement to the PCB, wherein coupling the slug arrangement to the PCB includes positioning at least a section of the first portion within the through-hole and creating a first solder interface between the first portion and the PCB;
    coupling a surface mount element to the slug arrangement, the surface mount element having a ground paddle, wherein coupling the surface mount element to the slug arrangement includes creating a second solder interface between the ground paddle and the first portion;
    causing the slug arrangement to contact a thermally conductive material arranged to absorb heat transferred from the surface mount element through the slug arrangement, wherein causing the slug arrangement to contact the thermally conductive material includes causing the plate portion to contact the thermally conductive material; and
    mechanically fastening the slug arrangement to the PCB, wherein mechanically fastening the slug arrangement to the PCB includes using at least one screw to mechanically couple the slug arrangement to the PCB.

12. A method comprising:
    obtaining a printed circuit board (PCB), the PCB including a top surface and a bottom surface, wherein the PCB has a through-hole defined therein;
    obtaining a slug arrangement, the slug arrangement being formed from an electrically and thermally conductive material, the slug arrangement including at least a first portion and a second portion, wherein the slug arrangement further includes a vertical compensation element;

coupling the slug arrangement to the PCB, wherein coupling the slug arrangement to the PCB includes positioning at least a section of the first portion within the through-hole and creating a first solder interface between the first portion and the PCB;

coupling a surface mount element to the slug arrangement, the surface mount element having a ground paddle, wherein coupling the surface mount element to the slug arrangement includes creating a second solder interface between the ground paddle and the first portion;

causing the slug arrangement to contact a thermally conductive material arranged to absorb heat transferred from the surface mount element through the slug arrangement; and adjusting the slug arrangement using the vertical compensation element to compensate for a variation in the thickness of the PCB.

13. The method of claim 1 further including coupling the slug arrangement to a thermally conductive material arranged to absorb heat transferred through the slug arrangement.

14. The method of claim 1 wherein the slug arrangement includes a vertical compensation element, and adjusting the slug arrangement to compensate for the variation in the thickness of the PCB includes adjusting the vertical compensation element.

* * * * *